US012575456B2

(12) United States Patent
Hong et al.

(10) Patent No.: US 12,575,456 B2
(45) Date of Patent: Mar. 10, 2026

(54) DISPLAY DEVICE

(71) Applicant: LG DISPLAY CO., LTD., Seoul (KR)

(72) Inventors: GiSang Hong, Seoul (KR); Jinkwon Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 376 days.

(21) Appl. No.: 18/240,274

(22) Filed: Aug. 30, 2023

(65) Prior Publication Data

US 2024/0222340 A1 Jul. 4, 2024

(30) Foreign Application Priority Data

Dec. 29, 2022 (KR) ......................... 10-2022-0188560

(51) Int. Cl.
| | |
|---|---|
| *H01L 25/16* | (2023.01) |
| *H01L 25/075* | (2006.01) |
| *H10D 86/40* | (2025.01) |
| *H10D 86/60* | (2025.01) |
| *H10H 20/831* | (2025.01) |
| *H10H 20/857* | (2025.01) |

(52) U.S. Cl.
CPC ........ *H01L 25/167* (2013.01); *H01L 25/0753* (2013.01); *H10D 86/481* (2025.01); *H10D*

*86/60* (2025.01); *H10H 20/8312* (2025.01); *H10H 20/857* (2025.01)

(58) Field of Classification Search
CPC ... H01L 25/167; H01L 25/0753; H10D 86/60; H10D 30/6723; H10D 86/481; H10D 30/6725; H10K 59/123; H10K 59/124; H10K 59/126; H10K 50/81; H10K 50/813; H10K 59/1213; H10K 59/131; H10H 20/8312; H10H 20/857
See application file for complete search history.

(56) References Cited

U.S. PATENT DOCUMENTS

2021/0202910 A1* 7/2021 Lee ......................... H10D 86/60

* cited by examiner

*Primary Examiner* — Thanhha S Pham
(74) *Attorney, Agent, or Firm* — PnK IP LLC

(57) ABSTRACT

A display device includes a thin-film transistor disposed on a substrate including an active layer, a gate electrode, a first electrode pattern, and a second electrode pattern; an insulating layer is disposed on the thin-film transistor; a barrier layer is disposed on the insulating layer; a planarization layer is disposed on the barrier layer; and a first electrode is disposed on the planarization layer, wherein the barrier layer is electrically connected to the first electrode pattern through the first electrode.

19 Claims, 15 Drawing Sheets

DISPLAY DEVICE

CROSS-REFERENCE TO RELATED APPLICATION

This application claims the priority of Korean Patent Application No. 10-2022-0188560, filed on Dec. 29, 2022, which is hereby incorporated by reference in its entirety.

BACKGROUND

Field of the Disclosure

The present disclosure relates to a display device.

Description of the Background

Display devices are widely used as display screens for notebook computers, tablet computers, smartphones, portable display devices, portable information devices, and the like, in addition to display devices for televisions or monitors.

Display devices may be categorized as reflective display devices and light-emitting display devices. Here, reflective display devices are configured such that natural light or light exiting an external lighting device is reflected to display information. Such light-emitting display devices are internally provided with light-emitting elements or a light source therein to display information using light generated by the internal light-emitting elements or the internal light source.

A display device having a light-scattering layer structure including quantum dots and the like is being developed to improve color reproducibility and luminous efficiency.

When a light-scattering layer structure is used, a light-scattering layer extending from a source/drain is used in the top portion of a driving transistor. In this case, however, the distances between major signal lines formed on the same layer as the source/drain and a cathode are reduced and thus parasitic capacitance is increased, thereby disadvantageously causing delays in signals.

SUMMARY

Accordingly, the present disclosure is to provide a display device capable of process optimization by reducing the parasitic capacitance between the major signal lines and the cathode and blocking light from above and hydrogen.

The present disclosure is also to provide a display device configured to reduce delays in signals by reducing parasitic capacitance by introducing a barrier layer between major signal lines and a cathode.

Aspects may provide a display device configured to block light from above and hydrogen by introducing a barrier layer on a thin-film transistor (TFT).

Aspects may provide a display device configured to enable process optimization by including a contact hole extending through a planarization layer and an insulating layer.

Aspects may provide a display device including: a substrate; a thin-film transistor disposed on the substrate and including an active layer, a gate electrode, a first electrode pattern, and a second electrode pattern; an insulating layer disposed on the thin-film transistor; a barrier layer disposed on the insulating layer; a planarization layer disposed on the barrier layer; and a first electrode disposed on the planarization layer. The barrier layer may be electrically connected to the first electrode pattern through the first electrode Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display device includes a substrate; a thin-film transistor disposed on the substrate and including an active layer, a gate electrode, a first electrode pattern, and a second electrode pattern; an insulating layer disposed on the thin-film transistor; a barrier layer disposed on the insulating layer; a planarization layer disposed on the barrier layer; a contact hole extending through the planarization layer; and a connecting electrode disposed in the contact hole, and the barrier layer may be electrically connected to the first electrode pattern through the connecting electrode.

According to various aspects, the display device may reduce delays in signals by reducing parasitic capacitance by introducing the barrier layer between major signal lines and the cathode.

According to various aspects, the display device may block light from above and hydrogen by introducing the barrier layer on the thin-film transistor.

According to various aspects, the display device may enable process optimization by including the contact hole extending through the planarization layer and the insulating layer.

It is to be understood that both the foregoing general description and the following detailed description are exemplary and explanatory and are intended to provide further explanation of the disclosure as claimed.

BRIEF DESCRIPTION OF THE DRAWINGS

The above and other features and advantages of the present disclosure will be more clearly understood from the following detailed description, taken in conjunction with the accompanying drawings, in which.

DETAILED DESCRIPTION

Figure 1:
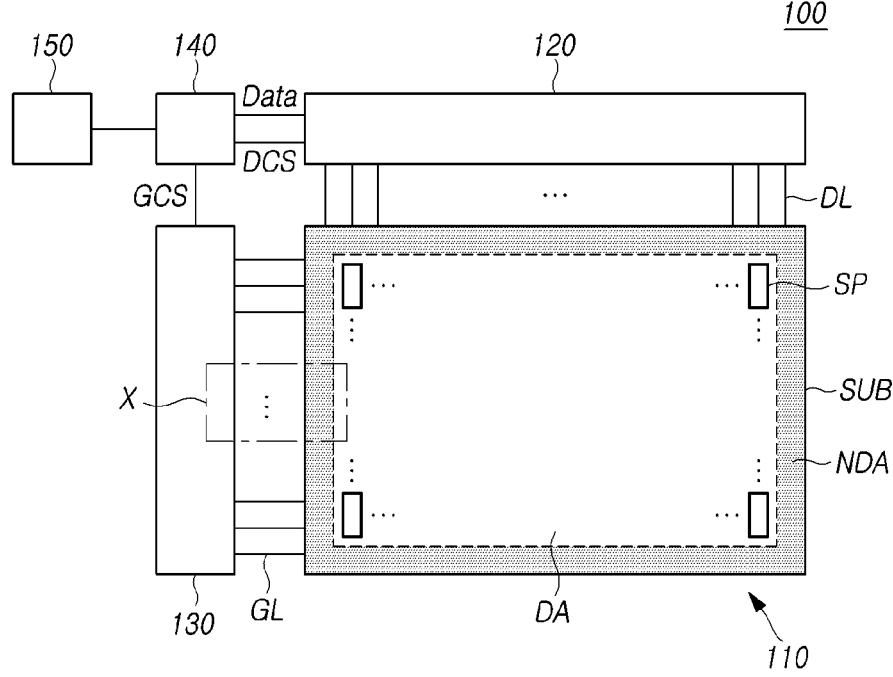
FIG. 1 is a diagram illustrating a system configuration of a display device according to aspects.

In the following description of examples or aspects of the present disclosure, reference will be made to the accompanying drawings in which it is shown by way of illustration specific examples or aspects that may be implemented, and in which the same reference numerals and signs may be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting", "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlap withs" etc. a second element, it should be interpreted that, not only may the first element "be directly connected or coupled to" or "directly contact or overlap with" the second element, but a third element may also be "interposed" between the first and second elements, or the first and second elements may "be connected or coupled to", "contact or overlap with", etc. each other via a fourth element. Here, the second element may be included in at least one of two or more elements that "are connected or coupled to", "contact or overlap with", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "may".

Hereinafter, a variety of aspects of the present disclosure will be described in detail with reference to the accompanying drawings.

FIG. 1 is a diagram illustrating a system configuration of a display device 100 according to aspects.

Referring to FIG. 1, the display device 100 according to aspects may include a display panel 110 and a driver circuit for driving the display panel 110.

The driver circuit may include a data driver circuit 120, a gate driver circuit 130, and the like. The driver circuit may further include a controller 140 to control the data driver circuit 120 and the gate driver circuit 130.

The display panel 110 may include a substrate SUB and signal lines such as a plurality of data lines DL and a plurality of gate lines GL disposed on the substrate SUB. The display panel 110 may include a plurality of subpixels SP connected to the plurality of data lines DL and the plurality of gate lines GL.

The display panel 110 may include a display area (or active area) DA on which images are displayed and a non-display area (or non-active area) NDA on which no images are displayed. In the display panel 110, the plurality of subpixels SP for displaying images are disposed in the display area DA, a pad part may be disposed in the non-display area NDA. The driver circuits 120, 130, and 140 may be electrically connected to or mounted on the pad part, and integrated circuits, printed circuits, and the like may be connected to the pad part.

The data driver circuit 120 is a circuit for driving the plurality of data lines DL, and may supply data signals to the plurality of data lines DL. The gate driver circuit 130 is a circuit for driving the plurality of gate lines GL, and may supply gate signals to the plurality of gate lines GL. The controller 140 may supply data control signals DCS to the data driver circuit 120 to control operation timing of the data driver circuit 120. The controller 140 may supply gate control signals GCS to the gate driver circuit 130 to control operation timing of the gate driver circuit 130.

The controller 140 may start scanning at timing set for respective frames, convert image data input from an external source into a data signal format readable by the data driver circuit 120, supply the converted image data Data to the data driver circuit 120, and control data driving at appropriate times according to the scanning.

The controller 140 may output a variety of gate control signals GCS including a gate start pulse (GSP), a gate shift clock (GSC), a gate output enable signal (GOE), and the like to control the gate driver circuit 130.

The controller 140 may output a variety of data control signals DCS including a source start pulse (SSP), a source sampling clock (SSC), a source output enable signal (SOE), and the like to control the data driver circuit 120.

The controller 140 may be implemented as a component separate from the data driver circuit 120 or may be combined with the data driver circuit 120 into an integrated circuit.

The data driver circuit 120 drives the plurality of data lines DL by receiving the image data Data from the controller 140 and supplying data voltages to the plurality of data lines DL in response to the image data Data. Here, the data driver circuit 120 will also be referred to as a source driver circuit.

The data driver circuit 120 may include one or more source driver integrated circuits (SDICs).

For example, each of the SDICs may be connected to the display panel 110 using a tape-automated bonding (TAB) structure, may be connected to a bonding pad of the display panel 110 using a chip-on-glass (COG) structure or a chip-on-panel (COP) structure, or may be implemented and connected to the display panel 110 using a chip-on-film (COF) structure.

The gate driver circuit 130 may output gate signals having a turn-on-level voltage or gate signals having a turn-off-level voltage under the control of the controller 140. The gate driver circuit 130 may sequentially drive the plurality of gate lines GL by sequentially supplying gate signals having a turn-on-level voltage to the plurality of gate lines GL.

The gate driver circuit 130 may be connected to the display panel 110 using a TAB structure, may be connected to bonding pads of the display panel 110 using a COG structure or a COP structure, or may be connected to the display panel 110 using a COF structure. Alternatively, the gate driver circuit 130 may be provided in the non-display area NDA of the display panel 110 using a gate-in-panel (GIP) structure. The gate driver circuit 130 may be disposed on or connected to the substrate SUB. That is, when the gate driver circuit 130 has a GIP structure, the gate driver circuit 130 may be disposed in the non-display area NDA of the substrate SUB. When the gate driver circuit 130 has a COG structure, a COF structure, or the like, the gate driver circuit 130 may be connected to the substrate SUB.

At least one driver circuit of the data driver circuit 120 and the gate driver circuit 130 may be disposed in the display area DA. For example, at least one driver circuit of the data driver circuit 120 and the gate driver circuit 130 may be disposed so as not to overlap with the subpixels SP or such that a portion or the entirety thereof overlap withs the subpixels SP.

When a specific gate line GL is opened by the gate driver circuit 130, the data driver circuit 120 may convert image data Data received from the controller 140 into an analog data voltage and supply the analog data voltage to the plurality of data lines DL.

The data driver circuit 120 may be connected to one side (e.g., the upper portion or lower portion) of the display panel 110. The data driver circuit 120 may be connected to both sides (e.g., the upper portion and the lower portion) of the display panel 110 or two or more sides of four sides of the display panel 110, depending on the driving method, the design of the display panel, or the like.

The gate driver circuit 130 may be connected to one side (e.g., the right portion or right portion) of the display panel 110. The gate driver circuit 130 may be connected to both sides (e.g., the right portion and the right portion) of the display panel 110 or two or more sides of four sides of the display panel 110, depending on the driving method, the design of the display panel, or the like.

The controller 140 may be a timing controller used in typical display technology, may be a control device including a timing controller and able to perform other control functions, may be a control device different from the timing controller, or a circuit inside a control device. The controller 140 may be implemented using a variety of circuits or electronic components such as an integrated circuit (IC), a field programmable gate array (FPGA), an application specific integrated circuit (ASIC), and a processor.

The controller 140 may be mounted on a printed circuit board (PCB), a flexible printed circuit (FPC), or the like, and may be electrically connected to the data driver circuit 120 and the gate driver circuit 130 through a PCB, an FPC, or the like.

The display device 100 according to aspects may be a display device including a backlight unit such as a liquid crystal display (LCD), or may be a self-light-emitting display device, such as an organic light-emitting diode (OLED) display device, a quantum dot display, and a micro-light-emitting diode (micro-LED) display.

When the display device 100 according to aspects is an OLED display device, each of the subpixels SP may include an OLED, i.e., a self-light-emitting diode, as a light-emitting element. When the display device 100 according to aspects is a quantum dot display device, each of the subpixels SP may include a light-emitting element comprised of a quantum dot forming a self-light-emitting semiconductor crystal. When the display device 100 according to aspects is a micro-LED display device, each of the subpixels SP may include a micro-LED based on an inorganic material and capable of emitting light by itself as a light-emitting element.

Figure 2:
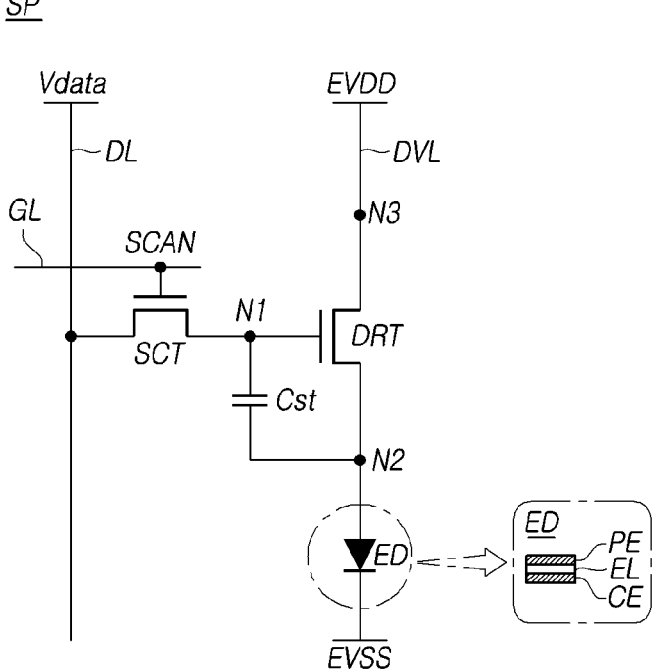
FIG. 2 is a diagram illustrating an equivalent circuit of a subpixel of the display device according to aspects.
Figure 3:
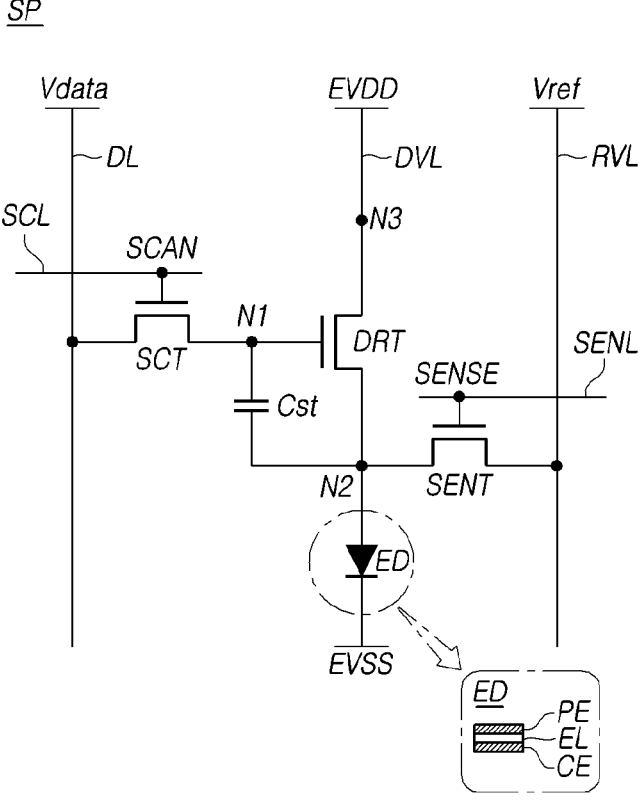
FIG. 3 is a diagram illustrating another equivalent circuit of a subpixel of the display device according to aspects.

FIG. 2 is a diagram illustrating an equivalent circuit of a subpixel SP of the display device 100 according to aspects, and FIG. 3 is a diagram illustrating another equivalent circuit of a subpixel SP of the display device 100 according to aspects.

Referring to FIG. 2, each of the plurality of subpixels SP disposed in the display panel 110 of the display device 100 according to aspects may include a light-emitting element ED, a driving transistor DRT, a scan transistor SCT, and a storage capacitor Cst.

Referring to FIG. 2, the light-emitting element ED may include a pixel electrode PE, a common electrode CE, and a light-emitting layer EL located between the pixel electrode PE and the common electrode CE The pixel electrode PE of the light-emitting element ED may be an electrode disposed in each of the subpixels SP, and the common electrode CE of the light-emitting element ED may be an electrode disposed in common in all of the subpixels SP. Here, the pixel electrode PE may be an anode, and the common electrode CE may be a cathode. In contrast, the pixel electrode PE may be a cathode, and the common electrode CE may be an anode.

For example, the light-emitting element ED may be an OLED, a LED, a quantum dot light-emitting element, or the like.

The driving transistor DRT may be a transistor for driving the light-emitting element ED, and may include a first node N1, a second node N2, a third node N3, and the like.

The first node N1 of the driving transistor DRT may be a gate node of the driving transistor DRT, and may be electrically connected to a source node or a drain node of the scan transistor SCT. The second node of the driving transistor DRT may be a source node or a drain node of the driving transistor DRT, may be electrically connected to a source node or a drain node of a sensing transistor, and may be electrically connected to the pixel electrode PE of the light-emitting element ED. The third node N3 of the driving transistor DRT may be electrically connected to a driving voltage line DVL through which a driving voltage EVDD is supplied.

The scan transistor SCT may be controlled by a scan signal SCAN, i.e., a type of gate signal, and may be connected to the first node N1 of the driving transistor DRT and a data line DL. In other words, the scan transistor SCT may be turned on or off by the scan signal SCAN supplied through a scan signal line SCL, i.e., a type of gate line GL, to control the connection between the data line DL and the first node N1 of the driving transistor DRT.

The scan transistor SCT may be turned on by the scan signal SCAN having a turn-on-level voltage to transfer a data voltage Vdata supplied through the data line DL to the first node N1 of the driving transistor DRT.

Here, when the scan transistor SCT is an N-type transistor, the turn-on-level voltage of the scan signal SCAN may be a high-level voltage. When the scan transistor SCT is a P-type transistor, the turn-on-level voltage of the scan signal SCAN may be a low-level voltage.

The storage capacitor Cst may be connected to the first node N1 and the second node N2 of the driving transistor DRT. The storage capacitor Cst is charged with an amount of electric charge corresponding to the voltage difference between two ends, and serves to maintain the voltage difference between the two ends during a predetermined frame time. Thus, the corresponding subpixel SP may emit light during the predetermined frame time.

Referring to FIG. 3, each of the plurality of subpixels SP disposed in the display panel 110 of the display device 100 according to aspects may further include a sensing transistor SENT.

The sensing transistor SENT may be controlled by a sensing signal SENSE, i.e., a type of gate signal, and may be connected to the second node N2 of the driving transistor DRT and a reference voltage line RVL. In other words, the sensing transistor SENT may be turned on or off by the sensing signal SENSE supplied through a sensing gate line SENL, i.e., another type of gate line GL, to control the connection between the reference voltage line RVL and the second node N2 of the driving transistor DRT.

The sensing transistor SENT may be turned on by the sensing signal SENSE having a turn-on-level voltage to transfer a reference voltage Vref supplied through the reference voltage line RVL to the second node N2 of the driving transistor DRT.

Alternatively, the sensing transistor SENT may be turned on by the sensing signal SENSE having a turn-on-level voltage to transfer the voltage of the second node N2 of the driving transistor DRT to the reference voltage line RVL.

Here, when the sensing transistor SENT is an N-type transistor, the turn-on-level voltage of the sensing signal SENSE may be a high-level voltage. When the sensing transistor SENT is a P-type transistor, the turn-on-level voltage of the sensing signal SENSE may be a low-level voltage.

The function of the sensing transistor SENT transferring the voltage of the second node N2 of the driving transistor DRT to the reference voltage line RVL may be used in driving for sensing the characteristics of the subpixel SP. In this case, the voltage transferred to the reference voltage line RVL may be a voltage by which the characteristics of the subpixel SP are calculated or a voltage in which the characteristics of the subpixel SP are reflected.

Each of the driving transistor DRT, the scan transistor SCT, and the sensing transistor SENT may be an N-type transistor or a P-type transistor. In the present disclosure, for the convenience of explanation, each of the driving transistor DRT, the scan transistor SCT, and the sensing transistor SENT will be illustrated as being an N-type transistor.

The storage capacitor Cst may be an external capacitor intentionally designed to be provided externally of the driving transistor DRT, rather than a parasitic capacitor (e.g. Cgs or Cgd), i.e., an internal capacitor present between the gate node and the source node (or the drain node) of the driving transistor DRT.

The scan signal line SCL and the sensing gate line SENL may be different gate lines GL. In this case, the scan signal SCAN and the sensing signal SENSE may be different gate signals, and on-off timing of the scan transistor SCT and on-off timing of the sensing transistor SENT in a single subpixel SP may be independent of each other. That is, the on-off timing of the scan transistor SCT and the on-off timing of the sensing transistor SENT in the single subpixel SP may be the same or different.

Alternatively, the scan signal line SCL and the sensing gate line SENL may be the same gate line GL. That is, the gate node of the scan transistor SCT and the gate node of the in a single subpixel SP may be connected to a single gate line GL. In this case, the scan signal SCAN and the sensing signal SENSE may be the same gate signal, and the on-off timing of the scan transistor SCT and the on-off timing of the sensing transistor SENT in the single subpixel SP may be the same.

The structures of the subpixels SP illustrated in FIGS. 2 and 3 are illustrative only, and the subpixel structure may have a variety of modifications each further including one or more transistors or one or more capacitors.

In addition, although the subpixel structure has been described with reference to FIGS. 2 and 3 by assuming that the display device 100 is a self-light-emitting display device, when the display device 100 is an LCD, each of the subpixels SP may include a transistor, a pixel electrode, and the like.

Figure 4:
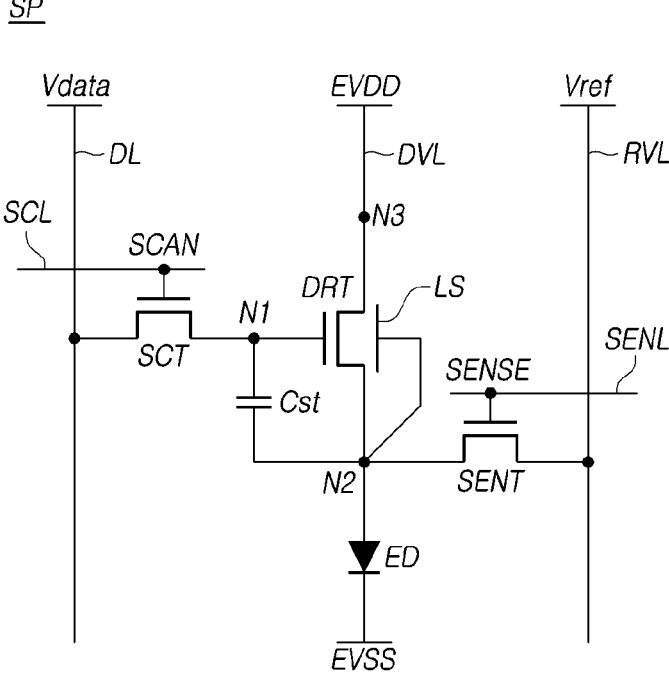
FIG. 4 is a diagram illustrating a light shield in a subpixel of the display device according to aspects.

FIG. 4 is a diagram illustrating a light shield (LS) in a subpixel SP of the display device 100 according to aspects.

Referring to FIG. 4, in each of the subpixels SP of the display device 100 according to aspects, the driving transistor DRT may have unique characteristics such as a threshold voltage and mobility. When the unique characteristics of the driving transistor DRT change, current driving ability (i.e., current supply performance) of the driving transistor DRT may also change, thereby changing light-emitting characteristics of the corresponding subpixel SP.

Element characteristics (e.g., threshold voltage and mobility) of the driving transistor DRT may change as the driving time of the driving transistor DRT passes. In addition, when light strikes the driving transistor DRT, specifically, the channel area of the driving transistor DRT, the element characteristics (e.g., threshold voltage and mobility) of the driving transistor DRT may change.

Thus, as illustrated in FIG. 4, a light shield may be provided adjacent to the driving transistor DRT to reduce changes in the element characteristics (e.g., threshold voltage and mobility) of the driving transistor DRT. For example, the light shield may be provided below the channel area of the driving transistor DRT.

In addition, the light shield may be provided below the channel area of the driving transistor DRT to serve as a body to the driving transistor DRT.

A body effect may occur in the driving transistor DRT. To reduce the influence of the body effect, the light shield serving as the body of the driving transistor DRT may be electrically connected to the second node N2 of the driving transistor DRT. Here, the second node N2 of the driving transistor DRT may be a source node of the driving transistor DRT.

In addition, the light shield LS may be disposed below not only the channel area of the driving transistor DRT but also the channel area of another transistor (e.g., SCT or SENT).

Figure 5:
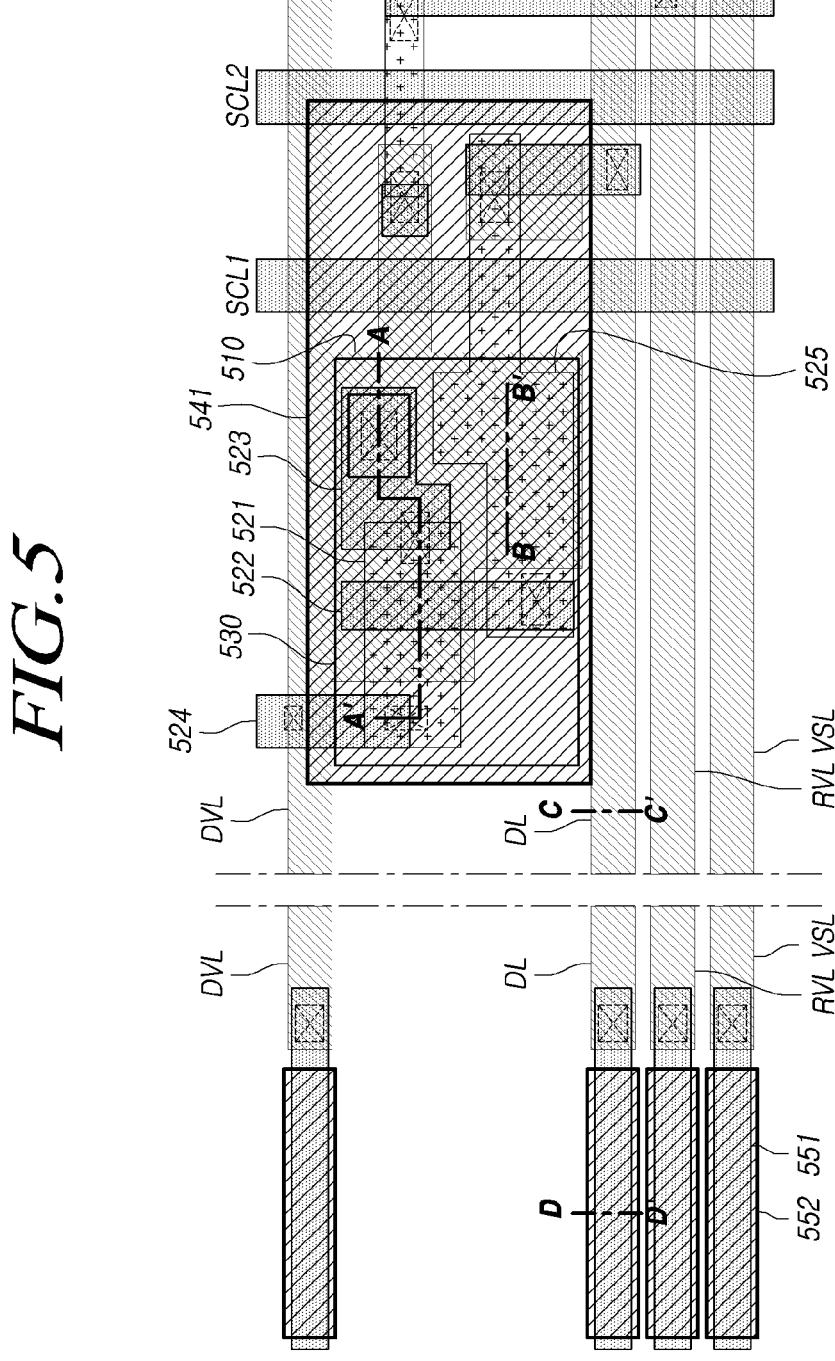
FIG. 5 is a plan diagram illustrating a schematic plan structure of area X illustrated in FIG. 1.
Figure 6:
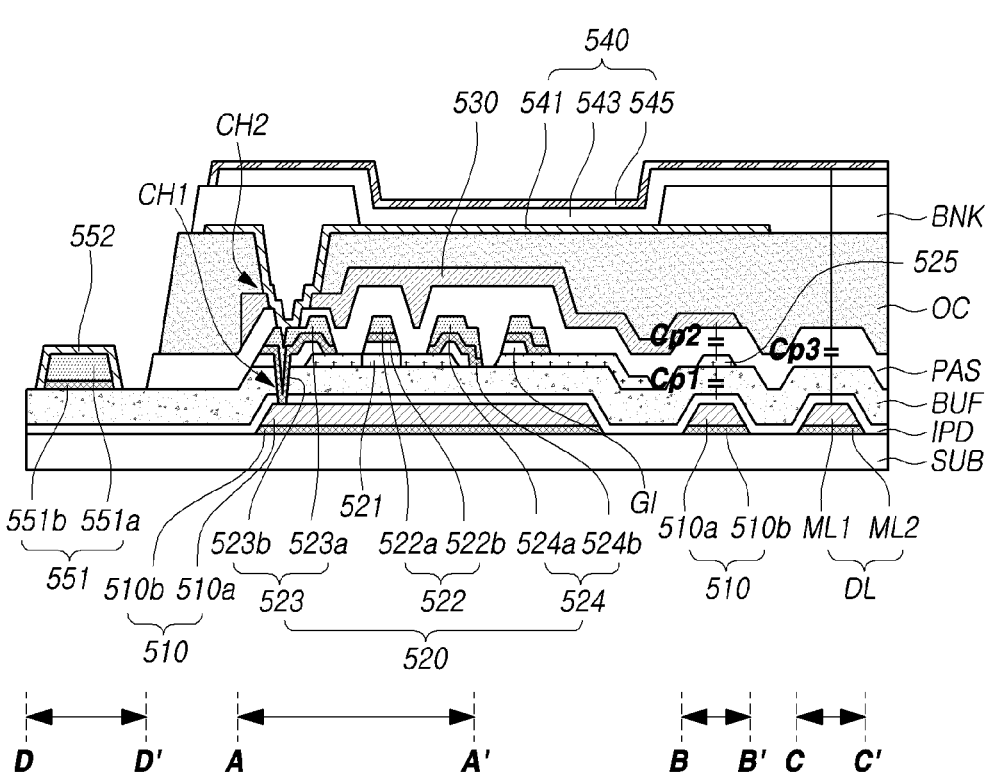
FIG. 6 is a cross-sectional diagram illustrating a cross-sectional structure taken along lines A-A', B-B', C-C', and D-D' in FIG. 5.

FIG. 5 is a plan diagram illustrating a schematic plan structure of the area X illustrated in FIG. 1, and FIG. 6 is a cross-sectional diagram illustrating a cross-sectional structure taken along the lines A-A', B-B', C-C', and D-D' in FIG. 5.

Referring to FIG. 5, the display device according to aspects may include a display area including one or more subpixels SP and a non-display area surrounding the display area and including a pad part.

A single subpixel SP may include at least one thin-film transistor (TFT), at least one storage capacitor, and a light-emitting element. The subpixel SP may include an emitting area from which light generated by the light-emitting element is emitted and a non-emitting area from which light is not emitted. The non-emitting area may be disposed to surround the emitting area.

Referring to FIG. 5, a single TFT may be a driving transistor DRT.

Referring to FIG. 5, a plurality of signal lines may be disposed in the subpixel SP. For example, a first signal line, a second signal line, a third signal line, and a fourth signal line extending in a first direction and spaced apart from each other may be disposed in the subpixel SP. In addition, a fifth signal line and a sixth signal line may extend in a second direction intersecting the first direction and be spaced apart from each other.

Here, the first signal line may be a driving voltage line DVL through which a driving voltage EVDD is supplied to the subpixel SP. The driving voltage line DVL may be electrically connected to a second electrode pattern 524 of the TFT, or may be the second electrode pattern 524 itself. The second signal line may be a data line DL through which a data voltage Vdata corresponding to an image data signal is supplied to the subpixel SP. The third signal line may be a reference voltage line RVL through which a reference voltage VREF is supplied. The fourth signal line may be a base voltage line VSL through which a base voltage EVSS is supplied. The fifth and sixth signal lines may be scan signal lines SCL1 and SCL2, respectively.

Referring to FIG. 5, the TFT may include an active layer 521, a gate electrode 522, a first electrode pattern 523, and a second electrode pattern 524. The first electrode pattern 523 may be a source electrode, and the second electrode pattern 524 may be a drain electrode. Alternatively, the first electrode pattern 523 may be a drain electrode, and the second electrode pattern 524 may be a source electrode.

A portion of the active layer 521 may overlap with a light shield layer 510. The light shield layer 510 may be disposed below the active layer 521.

The light shield layer 510 may be disposed on the same layer as the driving voltage line DVL, the data line DL, the reference voltage line RVL, and the base voltage line VSL. In addition, in the subpixel SP, the light shield layer 510 may be spaced apart from the driving voltage line DVL, the data line DL, the reference voltage line RVL, and the base voltage line VSL.

In addition, a portion of the active layer 521 may overlap with the gate electrode 522.

The portion of the active layer 521 overlapping with the gate electrode 522 may be the channel area of the TFT.

In addition, the active layer 521 may include a conductorized (or metalized) area, a portion of which may be in contact with the first electrode pattern 523 through half hole contact. The first electrode pattern 523 may be electrically connected to a first electrode 541 of the light-emitting element through a contact hole.

Referring to FIG. 5, a barrier layer 530 may overlap with the active layer 521, the gate electrode 522, the first electrode pattern 523, and the second electrode pattern 524. The barrier layer 530 may be electrically connected to the first electrode pattern 523 through the first electrode 541 in the contact hole.

Referring to FIG. 5, the pad part may be disposed in a portion of the non-display area surrounding the display area in which the subpixels SP are disposed. In the pad part, one or more pads may be disposed. Each of the pads may include one or more pad electrodes 551.

Referring to FIGS. 5 and 5, the display device according to aspects may include: a substrate SUB; a TFT 520 disposed on the substrate SUB and including the active layer 521, the gate electrode 522, the first electrode pattern 523, and the second electrode pattern 524; an insulating layer PAS disposed on the TFT 520; a barrier layer 530 disposed on the insulating layer PAS; a planarization layer OC disposed on the barrier layer 530; and the first electrode 541 disposed on the planarization layer OC.

The substrate SUB may be a glass substrate, a plastic substrate, or the like. The substrate SUB may be a flexible substrate, a bendable substrate, a stretchable substrate, or the like.

The light shield layer 510 may be disposed on the substrate SUB.

Referring to FIGS. 5 and 6, the light shield layer 510 may be disposed to overlap with the active layer 521 of the TFT 520. For example, the light shield layer 510 may be disposed to overlap with the channel area of the active layer 521.

When the channel area of the active layer 521 is exposed to light, the channel characteristics of the active layer 521 may be changed, thereby changing the operating characteristics of the TFT 520.

Thus, the light shield layer 510 may be disposed to overlap with the TFT 520, thereby preventing the channel area from being exposed to light. Accordingly, the TFT 520 may have stable operating characteristics.

Referring to FIG. 6, the light shield layer 510 may have a multilayer structure comprised of two layers, but is not limited thereto. For example, the light shield layer 510 may have a single-layer structure comprised of a single layer or a multilayer structure comprised of three or more layers.

Referring to FIG. 6, the light shield layer 510 may include a main light shield layer 510a and a sub-light shield layer 510b. For example, the main light shield layer 510a may include a single metal material such as Cu, Al, Mo, and Ti, while the sub-light shield layer 510 may include an alloy material such as MoTi.

The main light shield layer 510a may be electrically connected to the first electrode pattern 523 or the second electrode pattern 524. The sub-light shield layer 510b may be located below the main light shield layer 510a to be in electrical contact with the main light shield layer 510a.

A buffer layer BUF may be disposed on the light shield layer 510.

The buffer layer BUF may include an inorganic insulating material, such as silicon oxide (SiOx), silicon nitride (SiNx), and silicon oxynitride (SiON), but aspects are not limited thereto.

The buffer layer BUF is illustrated as having a single-layer structure in FIG. 6, but aspects are not limited thereto. For example, an aspect in which the buffer layer BUF has a multilayer structure may be included.

An interlayer insulating film IPD may be disposed between the light shield layer 510 and the buffer layer BUF. The interlayer insulating film IPD may be formed of an inorganic insulating material, such as silicon oxide (SiOx), silicon nitride (SiNx), and silicon oxynitride (SiON), or an organic insulating material, such as benzocyclobutene and photo acrylic. The interlayer insulating film IPD may be omitted.

The TFT 520 may be disposed on the buffer layer BUF.

The TFT 520 may include the active layer 521, the gate electrode 522, the first electrode pattern 523, and the second electrode pattern 524.

The active layer 521 may be disposed on the buffer layer BUF.

The active layer 521 may be formed of an oxide semiconductor. The active layer 521 may be formed of a metal oxide semiconductor comprised of an oxide of a metal, such as Mo, Zn, In, Ga, Sn, and Ti, or a combination of a metal, such as Mo, Zn, In, Ga, Sn, and Ti, or an oxide thereof.

For example, the active layer 521 may include one of zinc oxide (ZnO), zinc tin oxide (ZTO), zinc indium oxide (ZIO), indium oxide (InO), titanium oxide (TiO), indium gallium zinc oxide (IGZO), and indium zinc tin oxide (IZTO), but aspects are not limited thereto.

A gate insulating film GI may be disposed on a portion of the top surface and a side surface of the active layer 521. The gate insulating film GI may be formed of, for example, silicon oxide (SiOx).

The gate electrode 522, the first electrode pattern 523, and the second electrode pattern 524 may be disposed on the gate insulating film GI.

Referring to FIG. 6, the gate electrode 522 may have a multilayer structure comprised of two layers, but is not limited thereto. For example, the gate electrode 522 may have a single-layer structure comprised of a single layer or a multilayer structure comprised of three or more layers.

Each of gate material layers 522a and 522b of the gate electrode 522 may include a variety of conductive materials. For example, each of gate material layers 522a and 522b may include at least one from among Mo, Al, Cr, Au, Pt, Ti, Ni, Nd, Pd, Ag, W, or Cu or alloys thereof or may include a transparent conductive material, but aspects are not limited thereto.

As illustrated in FIG. 6, the gate insulating film GI may be disposed in an area overlapping with the gate electrode 522.

An area in which the active layer 521 overlap withs the gate electrode 522 may be the channel area of the TFT 520.

An area in which the active layer 521 does not overlap with the gate electrode 522 may be a conductorized area.

The first electrode pattern 523 may be a source electrode, and the second electrode pattern 524 may be a drain electrode. Alternatively, the first electrode pattern 523 may be a drain electrode, and the second electrode pattern 524 may be a source electrode.

Referring to FIG. 6, like the gate electrode 522, each of the first electrode pattern 523 and the second electrode pattern 524 may have a multilayer structure comprised of two or more layer, but is not limited thereto. For example, each of the first electrode pattern 523 and the second electrode pattern 524 may have a single-layer structure comprised of a single layer or a multilayer structure comprised of three or more layers.

Each of electrode pattern material layers 523a, 523b, 524a, and 524b of the first electrode pattern 523 and the second electrode pattern 524 may include a variety of conductive materials. For example, each of electrode pattern material layers 523a, 523b, 524a, and 524b may include one metal from among Mo, Al, Cr, Au, Pt, Ti, Ni, Nd, Pd, Ag, W, or Cu or alloys thereof or may include a transparent conductive material, but aspects are not limited thereto.

Each of the first electrode pattern 523 and the second electrode pattern 524 may be electrically/physically connected to the conductorized area of the active layer 521.

The gate electrode 522, the first electrode pattern 523, and the second electrode pattern 524 may be disposed on the same layer and include the same material.

The first electrode pattern 523 may be electrically connected to a portion of the top surface of the light shield layer 510 located below the buffer layer BUF through a contact hole extending through the buffer layer BUF. For example, the first electrode pattern 523 may be electrically connected to the light shield layer 510 through a first contact hole CH1. The first contact hole may extend through the buffer layer BUF or through both the buffer layer BUF and the interlayer insulating film IPD.

The insulating layer PAS for insulating the TFT 520 may be disposed on the active layer 521, the gate electrode 522, the first electrode pattern 523, and the second electrode pattern 524.

The insulating layer PAS may be formed of an inorganic insulating material, such as silicon oxide (SiOx), silicon nitride (SiNx), and silicon oxynitride (SiON), or may be implemented as a multilayer structure comprised thereof.

The barrier layer 530 may be disposed on the insulating layer PAS.

The barrier layer 530 may include a hydrogen-trapping metal (or hydrogen-absorbing metal) or an alloy thereof. The hydrogen-trapping metal may include a material having negative (−) hydrogen (H) formation energy. The material having negative (−) H formation energy may be defined as a hydrogen-trapping material.

Since the barrier layer 530 includes a hydrogen-trapping material, hydrogen from the outside or hydrogen from the inner organic layer and the inner inorganic layer may be trapped. Thus, hydrogen that has entered the barrier layer 530 may be maintained in a stable state to minimize the diffusion of hydrogen and prevent deteriorations in the active layer 521, thereby preventing degradations in the electrical properties of the TFT 520 and degradations in the reliability of the display device.

As the hydrogen-trapping metal or the hydrogen-trapping metal alloy, the barrier layer 530 may include one from among V, Nb, Ta, Hf, Zr, Ti, Ce, La, Y, Sc, Li, or MoTi or alloys thereof. For example, the barrier layer 530 may be a single layer including Ti or may be formed of MoTi.

The planarization layer OC may be disposed on the barrier layer 530.

The planarization layer OC may be formed of an organic insulating material such as an acrylic resin, an epoxy resin, a phenolic resin, a polyamide resin, and a polyimide resin.

A light-emitting element 540 and a bank layer BNK may be formed on the planarization layer OC. The light-emitting element 540 may include the first electrode 541, a light-emitting layer 543, and a second electrode 545. The first electrode 541 may be an anode, while the second electrode 545 may be a cathode.

The first electrode 541 may be provided on the planarization layer OC. The first electrode 541 may be electrically/physically connected to the first electrode pattern 523 through a contact hole extending through the planarization layer OC and the insulating layer PAS.

For example, the first electrode 541 may be electrically connected to the first electrode pattern 523 through a second contact hole CH2 extending through the planarization layer OC and the insulating layer PAS. The first contact hole CH1 and the second contact hole CH2 may partially overlap with each other.

The barrier layer 530 may be in ring contact with the first electrode 541 in the second contact hole CH2. That is, the barrier layer 530 may be electrically connected to the first electrode pattern 523 by ring contact with the first electrode 541 in the second contact hole CH2. For example, the first electrode 541 and the barrier layer 530 may be electrically connected by contact along a ring having an annular open area at the center of the contact area through the second contact hole CH2.

The first electrode 541, the barrier layer 530, and the light shield layer 510 may have the same potential or a similar potential when the light-emitting element 540 is being driven, since the first electrode 541, the barrier layer 530, the first electrode pattern 523, and the light shield layer 510 are electrically connected through the first contact hole CH1 and the second contact hole CH2. Thus, even in the case in which the barrier layer 530 is disposed below and spaced apart from the first electrode 541, parasitic capacitance may be minimized. Accordingly, delays or distortions in signals due to the parasitic capacitance may be prevented or minimized.

When the barrier layer 530 is electrically insulated from the first electrode 541 and the first electrode 541 is directly connected to the first electrode pattern 523, i.e., when the barrier layer 530 is floated, parasitic capacitance may be generated due to the distance between the first electrode 541 and the barrier layer 530, thereby causing delays and distortions in signals.

Such delays and distortions in signals may degrade the display quality of the display device. When the barrier layer 530 is floated, the potential of the barrier layer 530 is uncontrollable. The magnitude of the parasitic capacitance may periodically change, and the degree of the delays and distortions in signals may also periodically change.

In addition, due to the barrier layer 530 disposed between the insulating layer PAS and the planarization layer OC, the distances between the light-emitting element 540 and major signal lines, for example, the distance between the light-emitting element 540 and the data line DL may be increased. Thus, the parasitic capacitance of a parasitic capacitor Cp3 formed between the second electrode 545 of the light-emitting element 540 and the data line DL may be minimized, thereby preventing or minimizing the delays and distortions in signals due to the parasitic capacitance.

The bank layer BNK may be provided on boundaries of subpixel areas. The bank layer BNK may be formed on the planarization layer OC to cover the peripheral portions of the first electrode 541 to delimit the subpixel areas. An area in which the bank layer BNK is formed may be defined as a non-emitting area, since light is not emitted from the area in which the bank layer BNK is formed. An area in which the bank layer BNK is not formed may be defined as an emitting area, since light is emitted from the area in which the bank layer BNK is formed.

The bank layer BNK may be formed of an organic material, such as an acrylic resin, an epoxy resin, a phenolic resin, a polyamide resin, and a polyimide resin.

The light-emitting layer 543 may be provided on the first electrode 541 and the bank layer BNK. Specifically, the light-emitting layer 543 may cover the bank layer BNK and a portion of the first electrode 541 not covered with the bank layer BNK. For example, the light-emitting layer 543 may be an organic light-emitting layer.

The light-emitting layer 543 may generate light having one color from among red light, green light, blue light, or white light. The light-emitting layer 543 may be, for example, a white light-emitting layer generating white light. In this case, the light-emitting layer 543 may have a tandem structure in which two or more stacks are stacked on each other. Each of the stacks may include a hole transport layer, at least one light emitting layer, and an electron transport layer. In addition, a charge generation layer may be provided between the stacks.

In aspects, the light-emitting element 540 may be implemented using a top emission structure generating light in a direction away from the substrate SUB, i.e., in an upward direction. In this case, the first electrode 541 may be a reflective electrode including a metal material having a low work function and high reflecting efficiency.

The first electrode 541 may include, for example, a Ti/Al/Ti stacked structure in which Al and Ti are stacked, an ITO/Al/ITO stacked structure in which Al and indium tin oxide (ITO) are stacked, an ITO/Ag/ITO stacked structure in which Ag and ITO are stacked, an ITO/MoTi/ITO stacked structure in which MoTi and ITO are stacked, an IZO/MoTi/ITO stacked structure in which indium zinc oxide (IZO), MoTi, and ITO are stacked, an APC alloy, or an ITO/APC/ITO stacked structure in which the APC alloy and ITO are stacked. Here, the APC alloy is an alloy of Ag, Pd, and Cu.

The second electrode 545 may be formed on the light-emitting layer 543. The second electrode 545 may be a transmissive electrode. The second electrode 545 may be formed of a transparent conductive oxide such as ITO, antimony tin oxide (ATO), and IZO. In addition, the second electrode 545 may be a semi-transmissive electrode. The second electrode 545 may be implemented as a semi-transmissive thin metal film. The metal film may be an alloy or a multilayer structure of Mg, Ag, and Mg.

In addition, the barrier layer 530 may block light generated by the light-emitting element 540 and directed toward the active layer 521 to prevent deteriorations in the active layer 521, thereby preventing degradations in the electrical properties of the TFT 520 and degradations in the reliability of the display device.

Referring to FIG. 6, the display device according to aspects may include a capacitor.

The capacitor may include a first plate 511, a second plate 525 on the first plate, and a third plate 530 on the second plate.

The first plate 511 of the capacitor may be a metal plate. For example, the first plate 511 of the capacitor may be the light shield layer 510. Alternatively, the first plate 511 of the capacitor may be located on the same layer and formed of the same metal material as the light shield layer 510.

When the light shield layer 510 includes a plurality of layers 510a and 510b, the first plate 511 of the capacitor may also include a plurality of layers 510a and 510b.

The plurality of layers 510a and 510b of the first plate 511 may be formed of the same materials as the plurality of layers 510a and 510b of the first plate 511, respectively.

The first plate 511 includes a (1-1)th plate 511a and a (1-2)th plate 511b. The position and material of the (1-1)th plate 511a may correspond to the position and material of the sub-light shield layer 510b of the main light shield layer 510a and the sub-light shield layer 510b included in the light shield layer 510.

The position and material of the (1-2)th plate 511b of the (1-1)th plate 511a and the (1-2)th plate 511b included in the first plate 511 may correspond to the position and material of the main light shield layer 510a of the main light shield layer 510a and the sub-light shield layer 510b included in the light shield layer 510.

The second plate 525 of the capacitor may be another active layer 525 located on the same layer as the active layer 521 while in a conductorized state.

The third plate 530 of the capacitor may be the barrier layer 530.

The barrier layer 530 may extend to the edge of the first plate 511 while being disposed to overlap with the contact holes CH1 and CH2, the TFT 520, and the first plate 511.

In the display device according to aspects, the capacitor may include a first capacitor Cp1 between the first plate 511 and the second plate 525 and a second capacitor Cp2 between the second plate 525 and the third plate 530.

Referring to FIG. 6, the display device according to aspects may include a pad part. The pad part may be provided with one or more pads, each of which may include at least one pad electrode 551.

Referring to FIG. 6, the pad part may include the pad electrode 551 and a pad electrode capping layer 552 covering the top surface and side surfaces of the pad electrode 551.

Specifically, the buffer layer BUF may be disposed below the pad electrode 551. The pad electrode 551 may be disposed on the same layer and formed of the same material as the gate electrode 522, the first electrode pattern 523, and the second electrode pattern 524.

The pad electrode 551 may have a stacked structure of two pad electrode material layers 551a and 551b. The pad electrode material layers 551a and 551b may include the same material as the gate material layers 522a and 522b of the gate electrode 522 and the electrode pattern material layers 523a, 523b, 524a, and 524b of the first and second electrode patterns 523 and 524.

The pad electrode capping layer 552 may include the same material as the first electrode 541.

Figure 7:
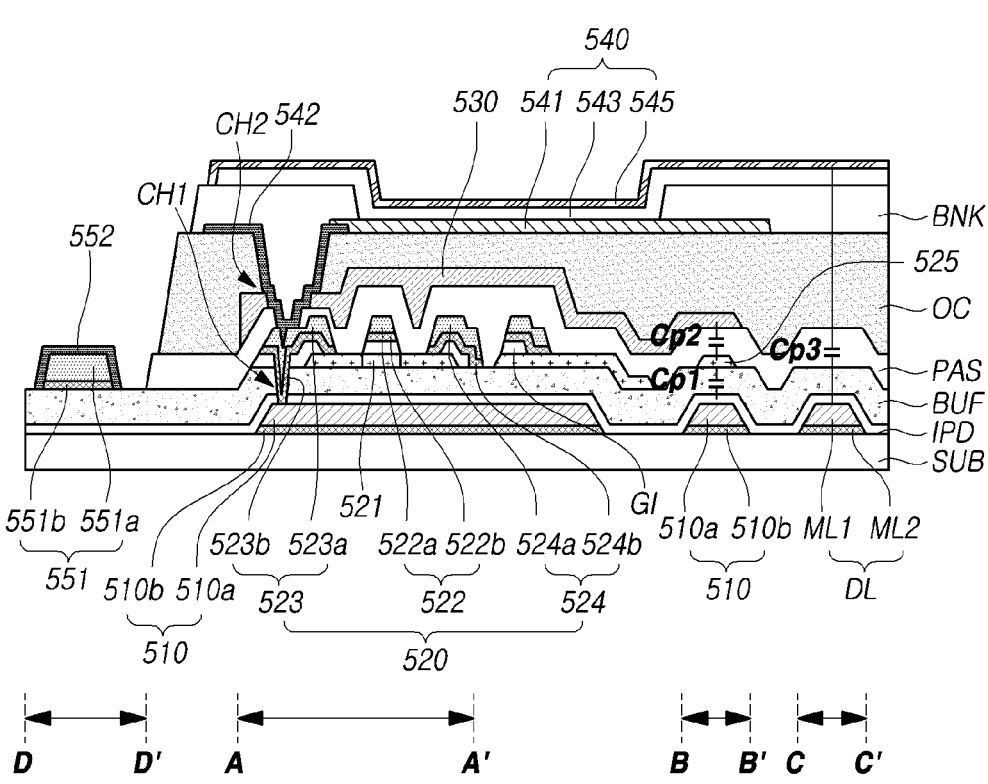
FIG. 7 is a cross-sectional diagram illustrating another cross-sectional structure taken along lines A-A', B-B', C-C', and D-D' in FIG. 1.

FIG. 7 is a cross-sectional diagram illustrating another cross-sectional structure taken along the lines A-A', B-B', C-C', and D-D' in FIG. 5. For example, FIG. 7 is a cross-sectional diagram illustrating a structure in which a connecting electrode 542 is disposed in a second contact hole CH2. In the following description, features the same as or similar to those described above with reference to FIGS. 1 to 6 will be omitted or briefly described.

Referring to FIG. 7, the display device according to aspects may include: a substrate SUB; a TFT 520 disposed on the substrate SUB and including an active layer 521, a gate electrode 522, a first electrode pattern 523, and a second electrode pattern 524; an insulating layer PAS disposed on the TFT 520; a barrier layer 530 disposed on the insulating layer PAS; a planarization layer OC disposed on the barrier layer 530; the contact hole CH2 extending through the insulating layer PAS and the planarization layer OC; and the connecting electrode 542 disposed in the contact hole CH2.

Referring to FIG. 7, the connecting electrode 542 may be disposed in the contact hole CH2 extending through the insulating layer PAS and the planarization layer OC. The connecting electrode 542 may be disposed in the second contact hole CH2 extending through the insulating layer PAS and the planarization layer OC and may extend to be disposed on a peripheral portion of the planarization layer OC.

The connecting electrode 542 may extend to be disposed on the peripheral portion of the planarization layer OC and, on the planarization layer OC, may be electrically connected to a first electrode 541 disposed on the planarization layer OC.

The connecting electrode 542 may be electrically/physically connected to the first electrode pattern 523 through the contact hole CH2.

For example, the connecting electrode 542 may be electrically connected to the first electrode pattern 523 through the second contact hole CH2 extending through the planarization layer OC and the insulating layer PAS. The first contact hole CH1 and the second contact hole CH2 may partially overlap with each other.

The connecting electrode 542 may be a single layer including ITO, MoTi, or the like.

The barrier layer 530 may be in ring contact with the connecting electrode 542 in the second contact hole CH2. That is, the barrier layer 530 may be electrically connected to the first electrode pattern 523 by ring contact with the connecting electrode 542 in the second contact hole CH2. For example, the connecting electrode 542 and the barrier layer 530 may be electrically connected by contact along a ring having an annular open area at the center of the contact area through the second contact hole CH2.

The barrier layer 530 may be electrically connected to the first electrode 541 through the connecting electrode 542. The barrier layer 530 may also be electrically connected to the first electrode pattern 523 through the connecting electrode 542.

The first electrode 541, the barrier layer 530, and a light shield layer 510 may have the same potential or a similar potential when the light-emitting element 540 is being driven, since the first electrode 541, the connecting electrode 542, the barrier layer 530, the first electrode pattern 523, and the light shield layer 510 are electrically connected through the first contact hole CH1 and the second contact hole CH2. Thus, even in the case in which the barrier layer 530 is disposed below and spaced apart from the first electrode 541, parasitic capacitance may be minimized. Accordingly, delays or distortions in signals due to the parasitic capacitance may be prevented or minimized.

When the barrier layer 530 is electrically insulated from the first electrode 541 and the first electrode 541 is directly connected to the first electrode pattern 523, i.e., when the barrier layer 530 is floated, parasitic capacitance may be generated due to the distance between the first electrode 541 and the barrier layer 530, thereby causing delays and distortions in signals.

Such delays and distortions in signals may degrade the display quality of the display device. When the barrier layer 530 is floated, the potential of the barrier layer 530 is uncontrollable. The magnitude of the parasitic capacitance may periodically change, and the degree of the delays and distortions in signals may also periodically change.

Referring to FIG. 7, the display device according to aspects may include a pad part. The pad part may be provided with one or more pads, each of which may include at least one pad electrode 551.

Referring to FIG. 7, the pad part may include the pad electrode 551 and a pad electrode capping layer 552 covering the top surface and side surfaces of the pad electrode 551.

Specifically, a buffer layer BUF may be disposed below the pad electrode 551. The pad electrode 551 may be disposed on the same layer and formed of the same material as the gate electrode 522, the first electrode pattern 523, and the second electrode pattern 524.

The pad electrode 551 may have a stacked structure of two pad electrode material layers 551a and 551b. The pad electrode material layers 551a and 551b may include the same material as the gate material layers 522a and 522b of the gate electrode 522 and the electrode pattern material layers 523a, 523b, 524a, and 524b of the first and second electrode patterns 523 and 524.

The pad electrode capping layer 552 may include the same material as the connecting electrode 542 but may include a different material from the first electrode 541.

For example, each of the pad electrode capping layer 552 and the connecting electrode 542 may have a single layer structure comprised of ITO, MoTi, or the like, while the first electrode 541 may include a Ti/Al/Ti stacked structure, an ITO/Al/ITO stacked structure, an ITO/Ag/ITO stacked structure, an ITO/MoTi/ITO stacked structure, an IZO/MoTi/ITO stacked structure, an APC alloy, or an ITO/APC/ITO stacked structure. The APC alloy is an alloy of Ag, Pd, and Cu.

FIGS. 8A to 8H are diagrams illustrating a process of fabricating a display panel according to aspects.

Figure 8A:
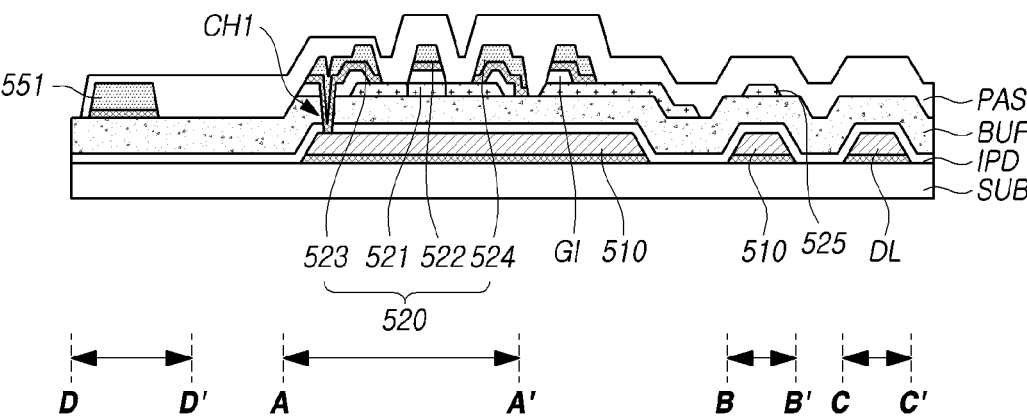
FIGS. 8A to 8H are diagrams illustrating a process of fabricating a display panel according to aspects.

Referring to FIG. 8A, a first conductive plate, a buffer layer BUF, and a semiconductor layer are sequentially formed on a substrate SUB. A portion of the first conductive plate forms a light shield layer 510, and another portion of the first conductive plate forms a first plate 511 and a data line DL. An interlayer insulating film IPD may be formed before the buffer layer BUF is formed. The semiconductor layer may be formed of an oxide semiconductor material. A portion of the semiconductor layer forms an active layer 521, while another portion of the semiconductor layer forms a second plate 525.

A gate insulating film GI is formed on the buffer layer BUF, the active layer 521, and the second plate 525, and then is etched to form a first contact hole CH1. Afterwards, a second conductive plate is formed. A portion of the second conductive plate forms a gate electrode 522, a first electrode pattern 523, and a second electrode pattern 524, while another portion of the second conductive plate forms a pad electrode 551. The first electrode pattern 523 is connected to the light shield layer 510.

An insulating layer PAS is formed to cover the top surfaces of the buffer layer BUF, the TFT 520, the pad electrode 551, and the second plate 525.

Figure 8B:
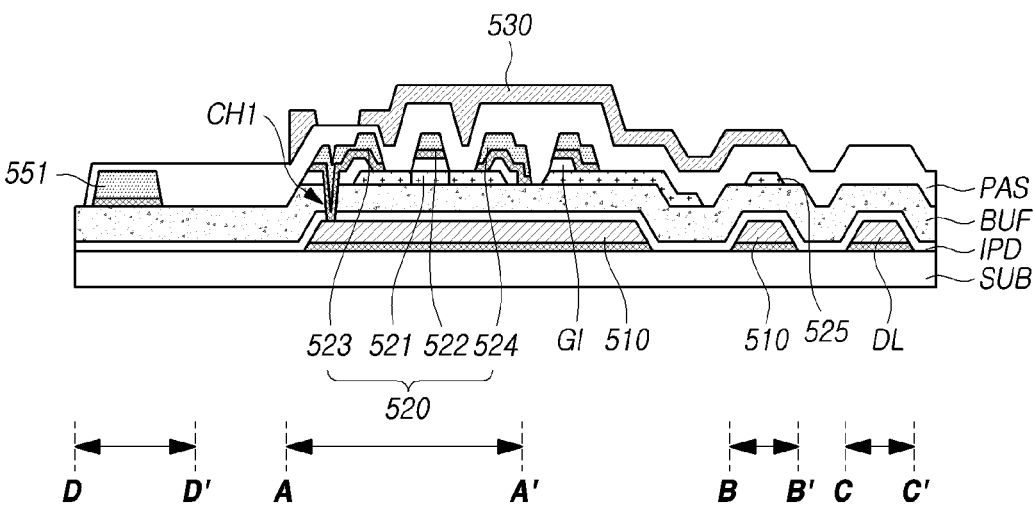

Referring to FIG. 8B, a barrier layer 530 is formed on the resultant structure, except for an area overlapping with a portion of the first contact hole CH1. For example, the barrier layer 530 may be formed of a single material such as MoTi.

Figure 8C:
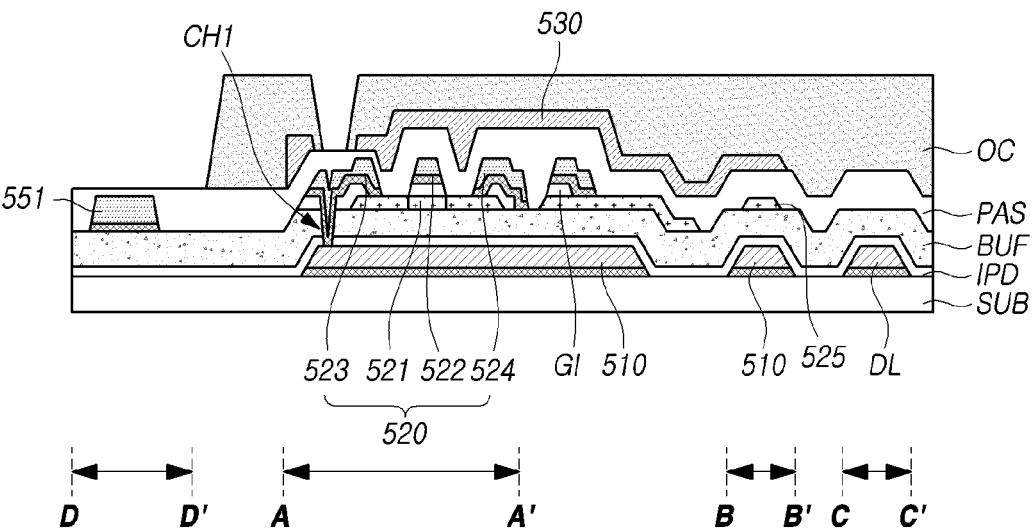

Referring to FIG. 8C, a planarization layer OC is formed on the insulating layer PAS and the barrier layer 530, and then a second contact hole is patterned.

Figure 8D:
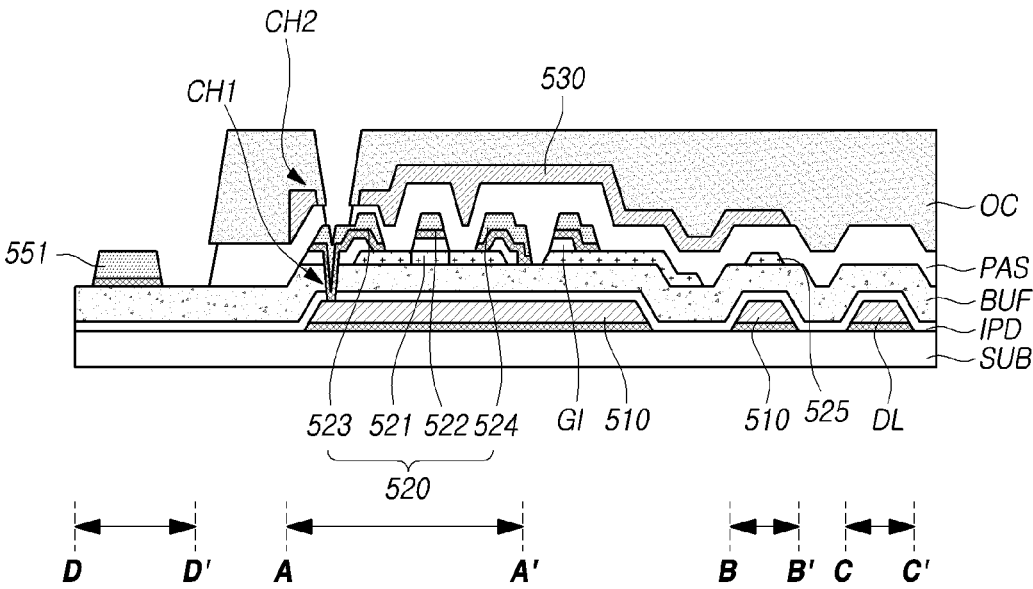

Referring to FIG. 8D, the insulating layer PAS is etched by buffered oxide etch (BOE) processing using the planarization layer OC as a mask. At this time, an inner portion of the insulating layer PAS located below the planarization layer OC may be etched, thereby forming an undercut in the planarization layer OC.

When the planarization layer OC, the insulating layer PAS, and the second contact hole CH2 are formed, an integrated mask may be used to reduce the number of masks compared to related-art processing, thereby enabling process optimization.

Figure 8E:
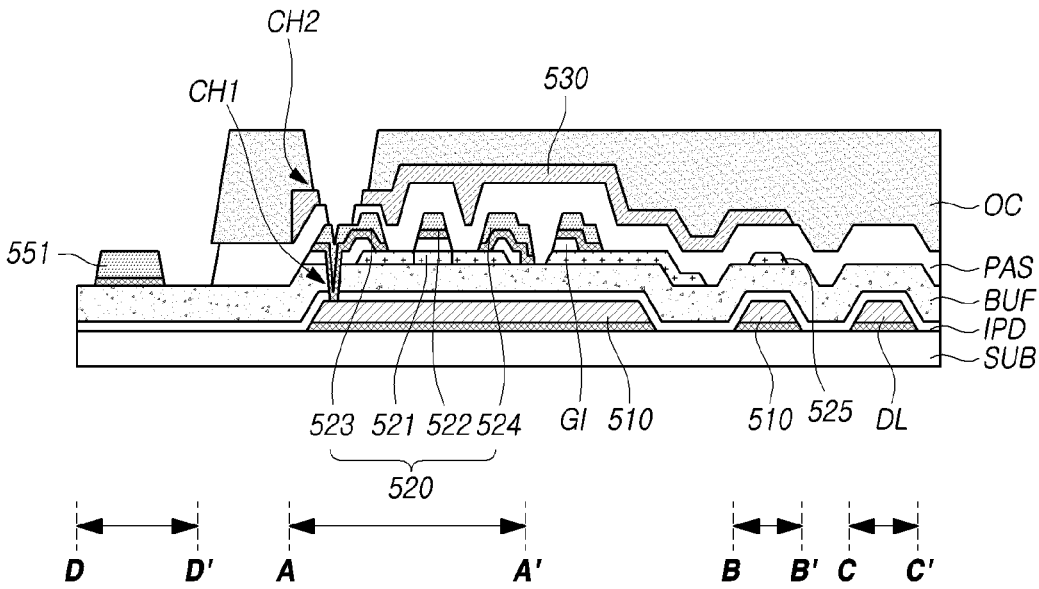

Referring to FIG. 8E, the undercut formed in the lower portion of the planarization layer OC is removing by ashing the planarization layer OC.

Figure 8F:
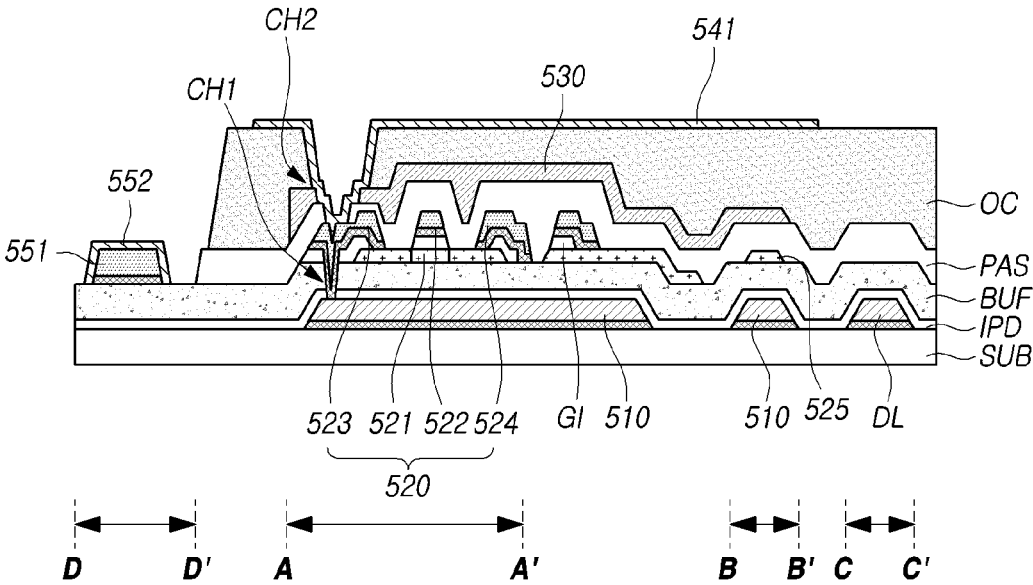

Referring to FIG. 8F, a first electrode material is formed and patterned on the planarization layer OC, the second contact hole CH2, and the pad electrode 551. A portion of the first electrode material forms a first electrode 541, while another portion of the first electrode material forms a pad electrode capping layer 552. Here, the first electrode 541 and the first electrode pattern 523 are electrically/physically connected in the second contact hole CH2, and the barrier layer 530 is electrically/physically connected to the first electrode 541 by ring contact. The barrier layer 530 may be electrically connected to the first electrode pattern 523 through the first electrode 541.

Although that the first electrode 541 is illustrated as being also formed in the second contact hole CH2 and being formed of the same material as the pad electrode capping layer 552 in FIG. 8F, aspects are not limited thereto. In another example, the connecting electrode 542 may be disposed in the second contact hole CH2.

In this case, the connecting electrode 542 is formed in the second contact hole CH2 and on the pad electrode 551 and a peripheral portion of the planarization layer OC adjacent to the second contact hole CH2. The connecting electrode 542 may be formed of the same material as the pad electrode capping layer 552 but a different material from a first electrode 541 to be formed later. For example, each of the connecting electrode 542 and the pad electrode capping layer 552 may be a single layer including ITO, MoTi, or the like, while the first electrode 541 may include a Ti/Al/Ti stacked structure, an ITO/Al/ITO stacked structure, an ITO/Ag/ITO stacked structure, an ITO/MoTi/ITO stacked structure, an IZO/MoTi/ITO stacked structure, an APC alloy, or an ITO/APC/ITO stacked structure.

The connecting electrode 542 may also serve to prevent the first electrode pattern 523, the barrier layer 530, and the like exposed through the inside of the second contact hole CH2 from being damaged by an etchant. In this case, when ITO is used for the connecting electrode 542, the connecting electrode 542 may be heat-treated after ITO patterning to be prevented from being damaged by the etchant. When MoTi is used for the connecting electrode 542, the connecting electrode 542 may be prevented from being damaged by the etchant without being heat-treated.

Figure 8G:
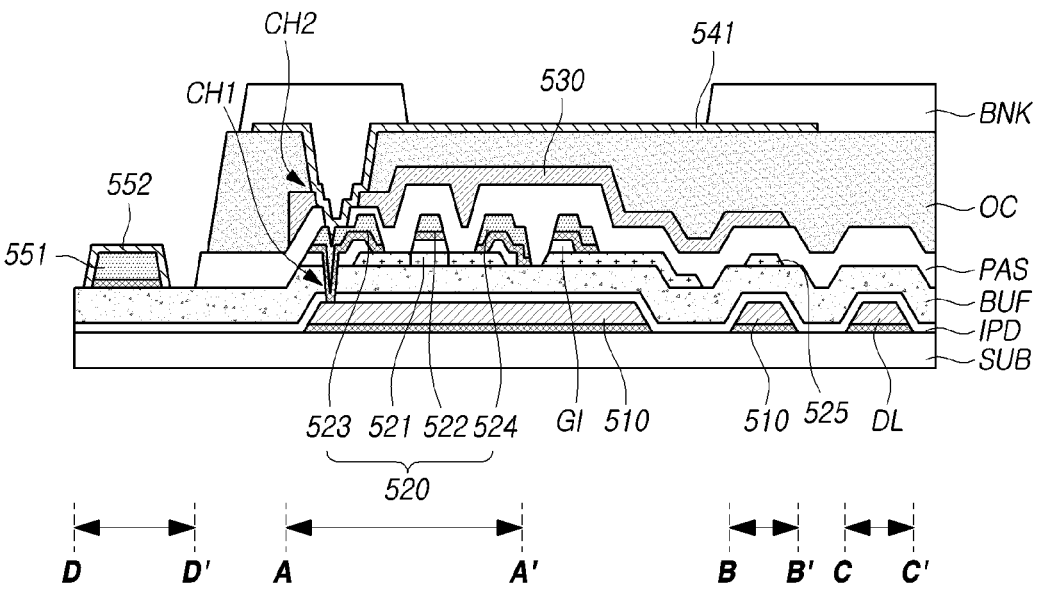

Referring to FIG. 8G, a bank layer BNK may be formed on the planarization layer OC. The bank layer BNK may be formed to cover peripheral portions of the second contact hole CH2 and the first electrode 541.

Figure 8H:
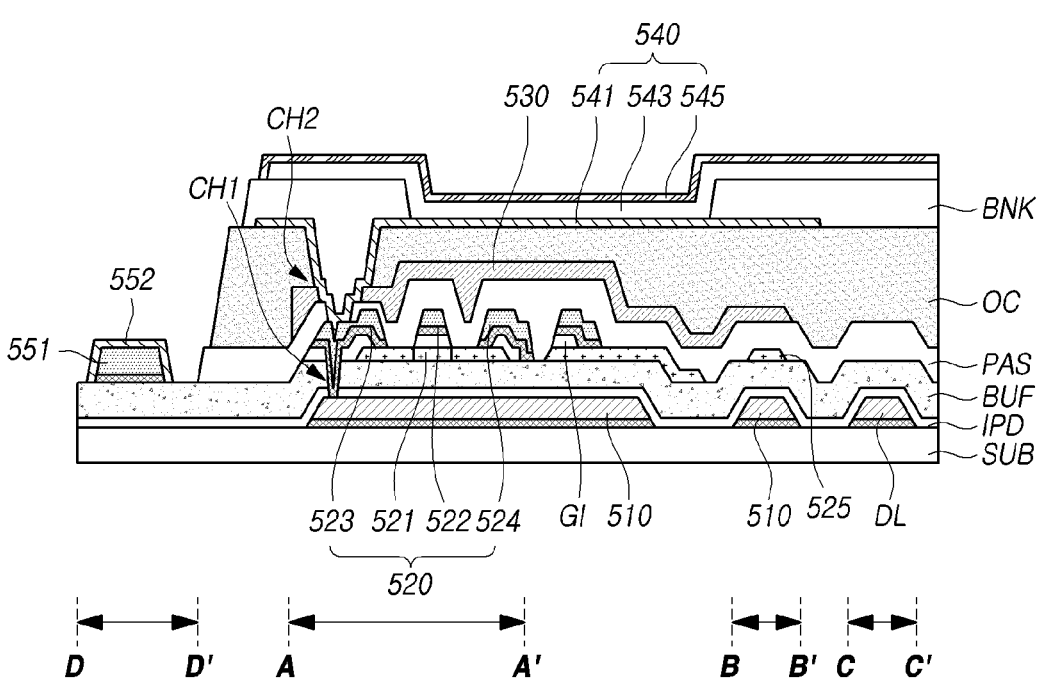

Referring to FIG. 8H, a light-emitting layer 543 and a first electrode 545 may be sequentially formed on the first electrode 541 and the bank layer BNK.

The above-described aspects of the present disclosure will be briefly reviewed as follows.

In the present disclosure, aspects may provide a display device including: a substrate SUB; a TFT 520 disposed on the substrate and including an active layer 521, a gate electrode 522, a first electrode pattern 523, and a second electrode pattern 524; an insulating layer PAS disposed on the TFT; a barrier layer 530 disposed on the insulating layer; a planarization layer OC disposed on the barrier layer; and a first electrode 541 disposed on the planarization layer OC. The barrier layer 530 may be electrically connected to the first electrode pattern 523 through the first electrode 541.

The display device may further include a contact hole CH2 extending through the insulating layer PAS and the planarization layer OC. The barrier layer 530 may be in ring contact with the first electrode 541 in the contact hole.

The barrier layer 530 may include a hydrogen-trapping metal or an alloy thereof.

The barrier layer 530 may include one from among V, Nb, Ta, Hf, Zr, Ti, Ce, La, Y, Sc, Li, or MoTi or alloys thereof.

The display device may further include: a buffer layer BUF disposed below the active layer 521; an interlayer insulating film IPD disposed below the buffer layer; and a light shield layer 510 located below the interlayer insulating film. The first electrode pattern 523 may be electrically connected to the light shield layer through a first contact hole CH1 extending through the buffer layer and the interlayer insulating film.

The display device may further include a capacitor. The capacitor may include a first plate 511, a second plate 525 on the first plate, and a third plate 530 on the second plate. The first plate 511 may be the light shield layer 510 or a metal located on the same layer as the light shield layer. The second plate 525 may be another active layer located on the same layer as the active layer 521 while in a conductorized state. The third plate 530 may be the barrier layer 530.

The barrier layer may extend to an edge of the first plate 511 while being disposed to overlap with the contact holes CH1 and CH2, the TFT 520, and the first plate 511.

The display device may further include a pad part. The pad part may include a pad electrode 551 disposed on the substrate SUB and a pad electrode capping layer 552 covering the top surface and side surfaces of the pad electrode.

The pad electrode 551 may be the same material as the gate electrode 522, the first electrode pattern 523, and the second electrode pattern 524. The pad electrode capping layer 552 may be the same material as the first electrode 541.

Aspects may provide a display device including: a substrate SUB; a TFT 520 disposed on the substrate and including an active layer 521, a gate electrode 522, a first electrode pattern 523, and a second electrode pattern 524; an insulating layer PAS disposed on the TFT; a barrier layer 530 disposed on the insulating layer; a planarization layer OC disposed on the barrier layer; a contact hole CH2 extending through the insulating layer PAS and the planarization layer OC; and a connecting electrode 542 disposed in the contact hole. The barrier layer 530 may be electrically connected to the first electrode pattern 523 through the connecting electrode 542.

The barrier layer 530 may be in ring contact with the connecting electrode 542 in the contact hole CH2.

The display device may further include a first electrode 541 disposed on the planarization layer OC. The connecting electrode 542 may extend to be disposed on a peripheral portion of the planarization layer OC. The first electrode 541 and the connecting electrode 542 may be connected on the peripheral portion of the planarization layer.

The barrier layer 530 may include a hydrogen-trapping metal or an alloy thereof.

The barrier layer 530 may include one from among V, Nb, Ta, Hf, Zr, Ti, Ce, La, Y, Sc, Li, or MoTi or alloys thereof.

The display device may further include: a buffer layer BUF disposed below the active layer 521; an interlayer insulating film IPD disposed below the buffer layer; and a light shield layer 510 located below the interlayer insulating film. The first electrode pattern 523 may be electrically connected to the light shield layer through a first contact hole CH1 extending through the buffer layer and the interlayer insulating film.

The display device may further include a capacitor. The capacitor may include a first plate 511, a second plate 525 on the first plate, and a third plate 530 on the second plate. The first plate 511 may be the light shield layer 510 or a metal located on the same layer as the light shield layer. The second plate 525 may be another active layer located on the same layer as the active layer 521 while in a conductorized state. The third plate 530 may be the barrier layer 530.

The barrier layer may extend to an edge of the first plate 511 while being disposed to overlap with the contact holes CH1 and CH2, the TFT 520, and the first plate 511.

The display device may further include a pad part. The pad part may include a pad electrode 551 disposed on the substrate SUB and a pad electrode capping layer 552 covering the top surface and side surfaces of the pad electrode.

The display device may further include a first electrode 541 disposed on the planarization layer OC. The first electrode 541 may be the same material as the gate electrode 522, the first electrode pattern 523, and the second electrode pattern 524. The pad electrode capping layer 552 may be the same material as the connecting electrode 542 but a different material from the first electrode 541.

According to aspects, the display device may reduce delays in signals by reducing parasitic capacitance by introducing the barrier layer between major signal lines and the cathode.

According to aspects, the display device may block light from above and hydrogen by introducing the barrier layer on the thin-film transistor.

According to aspects, the display device may enable process optimization by including the contact hole extending through the planarization layer and the insulating layer.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure.

It will be apparent to those skilled in the art that various modifications and variations can be made in the display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device comprising:
a substrate;
a thin-film transistor disposed on the substrate and comprising an active layer, a gate electrode, a first electrode pattern, and a second electrode pattern;
an insulating layer disposed on the thin-film transistor;
a barrier layer disposed on the insulating layer;
a planarization layer disposed on the barrier layer; and
a first electrode disposed on the planarization layer,
wherein the barrier layer is electrically connected to the first electrode pattern through the first electrode.

2. The display device according to claim 1, further comprising a contact hole extending through the insulating layer and the planarization layer,
wherein the barrier layer is in ring contact with the first electrode in the contact hole.

3. The display device according to claim 1, wherein the barrier layer comprises a hydrogen-trapping metal or an alloy thereof.

4. The display device according to claim 3, wherein the barrier layer comprises one of V, Nb, Ta, Hf, Zr, Ti, Ce, La, Y, Sc, Li, and MoTi or alloys thereof.

5. The display device according to claim 1, further comprising:
a buffer layer disposed below the active layer; and
a light shield layer located below the buffer layer,
wherein the first electrode pattern is electrically connected to the light shield layer through a contact hole extending through the buffer layer.

6. The display device according to claim 5, further comprising a capacitor,
wherein the capacitor comprises a first plate, a second plate on the first plate, and a third plate on the second plate,
wherein the first plate is the light shield layer or a metal located on the same layer as the light shield layer,
wherein the second plate is another active layer located on a same layer as the active layer while in a conductorized state, and
wherein the third plate is the barrier layer.

7. The display device according to claim 6, wherein the barrier layer extends to an edge of the first plate while being disposed to overlap with the contact holes, the thin-film transistor, and the first plate.

8. The display device according to claim 1, further comprising a pad part,
wherein the pad part comprises:
a pad electrode disposed on the substrate; and
a pad electrode capping layer covering a top surface and side surfaces of the pad electrode.

9. The display device according to claim 8, wherein the pad electrode comprises a same material as the gate electrode, the first electrode pattern, and the second electrode pattern, and wherein the pad electrode capping layer comprises the same material as the first electrode.

10. A display device comprising:

a substrate;

a thin-film transistor disposed on the substrate and comprising an active layer, a gate electrode, a first electrode pattern, and a second electrode pattern;

an insulating layer disposed on the thin-film transistor;

a barrier layer disposed on the insulating layer;

a planarization layer disposed on the barrier layer;

a contact hole extending through the planarization layer; and a connecting electrode disposed in the contact hole, wherein the barrier layer is electrically connected to the first electrode pattern through the connecting electrode.

11. The display device according to claim 10, wherein the barrier layer is in ring contact with the connecting electrode in the contact hole.

12. The display device according to claim 10, further comprising a first electrode disposed on the planarization layer, wherein the connecting electrode extends to be disposed on a peripheral portion of the planarization layer, and wherein the first electrode and the connecting electrode are connected on the peripheral portion of the planarization layer.

13. The display device according to claim 10, wherein the barrier layer comprises a hydrogen-trapping metal or an alloy thereof.

14. The display device according to claim 13, wherein the barrier layer comprises one of V, Nb, Ta, Hf, Zr, Ti, Ce, La, Y, Sc, Li, and MoTi or alloys thereof.

15. The display device according to claim 10, further comprising:

a buffer layer disposed below the active layer; and a light shield layer located below the buffer layer, wherein the first electrode pattern is electrically connected to the light shield layer through a first contact hole extending through the buffer layer.

16. The display device according to claim 15, further comprising a capacitor, wherein the capacitor comprises a first plate, a second plate on the first plate, and a third plate on the second plate, wherein the first plate is the light shield layer or a metal located on a same layer as the light shield layer, wherein the second plate is another active layer located on a same layer as the active layer while in a conductorized state, and wherein the third plate is the barrier layer.

17. The display device according to claim 16, wherein the barrier layer extends to an edge of the first plate while being disposed to overlap with the contact holes, the thin-film transistor, and the first plate.

18. The display device according to claim 10, further comprising a pad part, wherein the pad part comprises:

a pad electrode disposed on the substrate; and a pad electrode capping layer covering a top surface and side surfaces of the pad electrode.

19. The display device according to claim 18, further comprising a first electrode disposed on the planarization layer, wherein the pad electrode comprises the same material as the gate electrode, the first electrode pattern, and the second electrode pattern, and wherein the pad electrode capping layer comprises the same material as the first electrode but a different material from the first electrode.

* * * * *